United States Patent
Zur

(10) Patent No.: US 11,404,244 B1
(45) Date of Patent: Aug. 2, 2022

(54) HIGH-RESOLUTION X-RAY SPECTROSCOPY SURFACE MATERIAL ANALYSIS

(71) Applicant: APPLIED MATERIALS ISRAEL LTD., Rehovot (IL)

(72) Inventor: Yehuda Zur, Tel-Aviv (IL)

(73) Assignee: APPLIED MATERIALS ISRAEL LTD., Rehovot (IL)

(*) Notice: Subject to any disclaimer, the term of this patent is extended or adjusted under 35 U.S.C. 154(b) by 1 day.

(21) Appl. No.: 17/173,016

(22) Filed: Feb. 10, 2021

(51) Int. Cl.
*H01J 37/28* (2006.01)
*H01J 37/244* (2006.01)
*G01N 23/2252* (2018.01)
*H01J 37/22* (2006.01)

(52) U.S. Cl.
CPC .......... *H01J 37/28* (2013.01); *G01N 23/2252* (2013.01); *H01J 37/222* (2013.01); *H01J 37/244* (2013.01); *H01J 2237/2442* (2013.01); *H01J 2237/2807* (2013.01)

(58) Field of Classification Search
CPC ........ H01J 37/28; H01J 37/222; H01J 37/244; H01J 2237/2442; H01J 2237/2807; G01N 23/2252
See application file for complete search history.

(56) References Cited

U.S. PATENT DOCUMENTS

| | | | |
|---|---|---|---|
| 6,670,610 B2 | 12/2003 | Shemesh et al. | |
| 7,443,953 B1 | 10/2008 | Yun et al. | |
| 7,659,506 B2 | 2/2010 | Avinun-Kalish et al. | |
| 8,709,269 B2 | 4/2014 | Shemesh | |
| 9,607,233 B2* | 3/2017 | Kaizerman | G06K 9/6256 |
| 9,625,398 B1* | 4/2017 | Campbell | G01N 23/2252 |
| 9,702,835 B1* | 7/2017 | Campbell | G01N 23/22 |
| 9,715,723 B2* | 7/2017 | Shlain | G06T 7/0004 |
| 9,905,394 B1* | 2/2018 | Bhattiprolu | H01J 37/244 |
| 9,928,990 B2* | 3/2018 | Campbell | G01N 23/2252 |
| 10,043,264 B2* | 8/2018 | Greenberg | G06K 9/6269 |
| 10,468,230 B2* | 11/2019 | Lavely | G01N 23/2251 |
| 10,522,323 B2* | 12/2019 | Tiemeijer | H01J 37/285 |
| 10,535,495 B2* | 1/2020 | Willis | H01J 37/20 |
| 10,825,648 B2* | 11/2020 | Hendriksen | H01J 37/28 |
| 10,830,715 B2* | 11/2020 | Campbell | G01B 15/02 |
| 10,890,545 B2* | 1/2021 | Bender | H01J 37/1478 |
| 10,922,809 B2* | 2/2021 | Shemesh | G06T 7/001 |

(Continued)

OTHER PUBLICATIONS

PCT/US2022/013327, "International Search Report and Written Opinion", dated May 10, 2022, 10 pages.

*Primary Examiner* — David A Vanore
(74) *Attorney, Agent, or Firm* — Kilpatrick Townsend & Stockton LLP

(57) ABSTRACT

A method of performing x-ray spectroscopy surface material analysis of a region of interest of a sample with an evaluation system that includes a scanning electron microscope (SEM) column and an x-ray detector, the method comprising: identifying an element expected to be within the region of interest; selecting a landing energy for a charged particle beam generated by the SEM column based on the identified element; scanning the region of interest with a charged particle beam set to the selected landing energy; detecting x-rays generated while the region of interest is scanned by the charged particle beam; and generating a two-dimensional image of the scanned region of interest based on the detected x-rays.

20 Claims, 7 Drawing Sheets

(56) References Cited

U.S. PATENT DOCUMENTS

| | | | |
|---|---|---|---|
| 11,022,565 B2* | 6/2021 | Shemesh | G01N 23/2206 |
| 2008/0273662 A1 | 11/2008 | Yun et al. | |
| 2016/0169816 A1 | 6/2016 | Peters et al. | |
| 2017/0067838 A1 | 3/2017 | Anan et al. | |
| 2018/0136147 A1* | 5/2018 | Randolph | G01N 23/2257 |
| 2019/0172681 A1 | 6/2019 | Owen et al. | |
| 2021/0033550 A1* | 2/2021 | Shemesh | G01N 23/2206 |

\* cited by examiner

HIGH-RESOLUTION X-RAY SPECTROSCOPY SURFACE MATERIAL ANALYSIS

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen of an electronic structure such as a silicon wafer can be analyzed in a scanning electron microscope (SEM) to study a specific characteristic feature in the wafer. Such a characteristic feature may include the circuit fabricated and any defects formed during the fabrication process. An electron microscope is one of the most useful pieces of equipment for analyzing the microscopic structure of semiconductor devices.

When examining a specimen with an electron beam from an SEM tool, x-rays are generated as a result of the irradiation when the electrons impact the surface of the specimen. The x-rays can be analyzed using analytical energy dispersive x-ray spectroscopy (EDX) or wavelength-dispersive x-ray spectroscopy (WDX) techniques to provide quantitative information about the elemental composition of the sample. The x-ray photons can also project an image of the actual pattern morphology at the specimen surface, which can be used to characterize various aspects such as elemental composition, physical dimensions (CD), local or global variation from a simulated architecture (defectivity), the physical location of a pattern relative to other parts of the physical architecture (overlay).

Some currently known EDX analysis techniques suffer from poor resolution, however, making it difficult to detect small feature size elements. Thus, improvements in EDX analysis techniques are desirable.

BRIEF SUMMARY OF THE INVENTION

Some embodiments of the disclosure pertain to improved methods and techniques for performing x-ray spectroscopy surface material analysis of a sample that enable high resolution material analysis and high-resolution 2D images of the sample surface to be generated.

In some embodiments a method of performing x-ray spectroscopy surface material analysis of a region of interest of a sample with an evaluation system that includes a scanning electron microscope (SEM) column and an x-ray detector is provided. The method can include: identifying an element expected to be within the region of interest; selecting a landing energy for a charged particle beam generated by the SEM column based on the identified element; scanning the region of interest with a charged particle beam set to the selected landing energy; detecting x-rays generated while the region of interest is scanned by the charged particle beam; and generating a two-dimensional image of the scanned region of interest based on the detected x-rays.

In some embodiments a plurality of elements expected to be within the region of interest can be identified and the method can further include sequentially generating a plurality of two-dimensional images of the region of interest corresponding in number to the plurality of identified elements, where each two-dimensional image in the plurality of two-dimensional images is generated by: selecting a landing energy for a charged particle beam generated by the SEM column based on a unique one of the elements in the plurality of elements; scanning the region of interest with a charged particle beam set to the selected landing energy; detecting x-rays generated while the region of interest is scanned by the charged particle beam; and generating a two-dimensional image of the scanned region of interest based on the detected x-rays.

In some implementations, where a two-dimensional images are generated for each of a plurality of elements, the implementations can include one or more of the following features. The two-dimensional images generated for each of the plurality of elements can be combined into a single image representing a total material analysis. The evaluation system can identify the plurality of elements expected within the region of interest based on mapping of the ROI to a simulated architecture of the sample. The evaluation system can identify the plurality of elements expected within the region of interest based on an initial high energy x-ray scan of the entire region of interest. The user can identify the plurality of elements to the evaluation system through a user interface to the system. The evaluation system can automatically identify a landing energy for each of the plurality of elements based on calibration data stored in a database. The evaluation system can present an initial recommendation for a landing energy for each of the plurality of elements to a user based on calibration data stored in a database and the user can accept or update the recommended landing energy through a user interface to the system. The method can further include enabling a user to identify a landing energy for each of the plurality of elements to the evaluation system through a user interface to the system. The method can further include selecting a different landing energy for each of the elements in the plurality of elements.

Various implementations of the embodiments described herein can include one or more of the following features. The two-dimensional image of the scanned region can comprise a plurality of pixels and a contrast of the two-dimensional image can be determined by the x-ray signal strength of each pixel in the plurality of pixels. The evaluation system can automatically select the landing energy for the charged particle beam by accessing a database that associates certain landing energies to certain elements. The evaluation system can automatically select the landing energy for the charged particle beam based on a desired spatial resolution input by a user.

In some embodiments the method can include identifying at least first and second elements expected to be within the region of interest where the first element has a first characteristic energy and the second element has a second characteristic energy different from the first characteristic energy and where the method can further include generating first and second two dimensional images, each of which is made up of a plurality of pixels, of the region of interest. The first two-dimensional image can be generated by: (i) selecting a first landing energy for a charged particle beam generated by the SEM column based the first element; (ii) scanning the region of interest with a first charged particle beam set to the first landing energy; (iii) detecting a first set of x-rays generated while the region of interest is scanned by the first charged particle beam; and (iv) generating the first two-dimensional image of the scanned region of interest based on the first set of detected x-rays, where a contrast of the first two-dimensional image is determined by an x-ray signal strength of each pixel in the first plurality of pixels. The second two-dimensional image can be generated by: (i) selecting a second landing energy for a charged particle beam generated by the SEM column based the second element, the second landing energy being different than the first landing energy; (ii) scanning the region of interest with a second charged particle beam set to the second landing energy; (iii) detecting a second set of x-rays generated while the region of interest is scanned by the second charged particle beam; and (iv) generating the second two-dimensional image of the scanned region of interest based on the second set of detected x-rays, where a contrast of the second two-dimensional image is determined by an x-ray signal strength of each pixel in the second plurality of pixels.

In some embodiments a method of performing x-ray spectroscopy surface material analysis of a region of a sample with an evaluation system that includes a scanning electron microscope (SEM) column and an x-ray detector is provided where the method includes: identifying a region of interest on the sample; identifying a plurality of elements expected to be within the region of interest; sequentially generating a plurality of two-dimensional images of the region of interest corresponding in number to the plurality of identified elements. Each of the sequentially generated two-dimensional images in the plurality of two-dimensional images can be generated by: selecting a landing energy for a charged particle beam generated by the SEM column based on a unique one of the elements in the plurality of elements; scanning the region of interest with a charged particle beam set to the selected landing energy; detecting x-rays generated while the region of interest is scanned by the charged particle beam; and generating a two-dimensional image of the scanned region of interest based on the detected x-rays.

Some embodiments pertain to a non-transitory computer-readable medium that stores instructions for performing x-ray spectroscopy surface material analysis of a region of a sample according to any of the methods above or herein. For example, by: identifying an element expected to be within the region of interest; selecting a landing energy for a charged particle beam generated by the SEM column based on the identified element; scanning the region of interest with a charged particle beam set to the selected landing energy; detecting x-rays generated while the region of interest is scanned by the charged particle beam; and generating a two-dimensional image of the scanned region of interest based on the detected x-rays.

Some embodiments pertain to a system for performing x-ray spectroscopy surface material analysis of a region of a sample according to any of the methods set forth above or herein. For example, the system can include: a vacuum chamber; a sample support configured to hold a sample within the vacuum chamber during a sample evaluation process; a scanning electron microscope (SEM) column configured to direct a charged particle beam into the vacuum chamber toward the sample; and a processor and a memory coupled to the processor. The memory can include a plurality of computer-readable instructions that, when executed by the processor, cause the system to: identify an element expected to be within the region of interest; select a landing energy for a charged particle beam generated by the SEM column based on the identified element; scan the region of interest with a charged particle beam set to the selected landing energy; detect x-rays generated while the region of interest is scanned by the charged particle beam; and generate a two-dimensional image of the scanned region of interest based on the detected x-rays.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure.

Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure enable high resolution material analysis and high-resolution 2D images of a sample surface to be generated using x-ray spectroscopy techniques.

Example Sample Evaluation Tool

Figure 1:
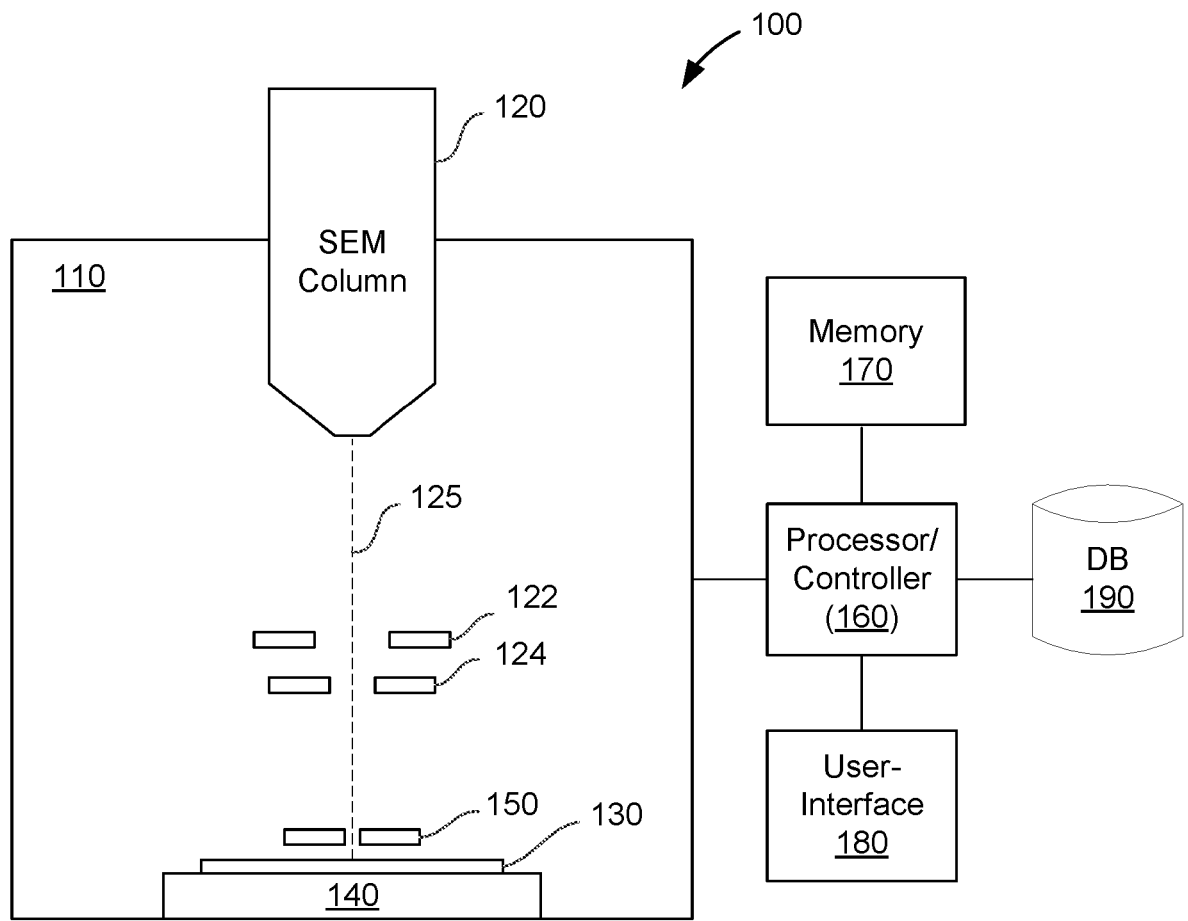
FIG. 1 is simplified illustration of a sample evaluation system according to some embodiments of the disclosure.

In order to better understand and appreciate the disclosure, reference is first made to FIG. 1, which is a simplified schematic illustration of a sample evaluation system 100 according to some embodiments of the disclosure. Sample evaluation system 100 can be used for, among other operations, defect review and analysis of structures formed on samples, such as semiconductor wafers.

System 100 can include a vacuum chamber 110 along with a scanning electron microscope (SEM) column 120. A supporting element 140 can support a sample 130 (e.g., a semiconductor wafer) within chamber 110 during a processing operation in which the sample 130 (sometimes referred to herein as an "object" or a "specimen") is subject to a charged particle beam 125 from the SEM column.

SEM column 120 is connected to vacuum chamber 110 so that charged particle beam 125 generated by the column propagates through a vacuumed environment formed within vacuum chamber 110 before impinging on sample 130. SEM column 120 can generate an image of a portion of sample 130 by illuminating the sample with a charged particle beam, detecting particles emitted due to the illumination and generating charged particle images based on the detected particles.

The particle imaging process typically includes scanning a charged particle beam back-and-forth (e.g., in a raster or other scan pattern) across a particular area of the sample being imaged. One or more lenses 122, 124 coupled to the charged particle column can implement the scan pattern as is known to those of skill in the art. Towards this end, in some embodiments lenses 122, 124 can be deflecting lenses, such as magnetic lenses, electrostatic lenses or a combination of both electrical and magnetic lenses.

The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

System 100 can also include an energy dispersive x-ray spectroscopy (EDX) detector 150 that can be used to determine a composition of one or more microscopic elements in a region of interest (ROI) at the surface of sample 130. EDX detector 150 collects x-ray photons emitted as a result of an illumination of the elements by charged particle beam 125. The EDX detector 150 can include an energy analyzer for determining the energy of photons that are detected by the detector, which in turn can enable system 100 to characterize the element from which an x-ray photon was emitted. As non-limiting examples, EDX detector 150 can collect information to generate x-ray spectroscopy graphs of a sample, such as those shown in FIGS. 2 and 4A and 4B below.

One or more controllers 160, such as a processor or other hardware unit, can control the operation of system 100 by executing computer instructions stored in one or more computer-readable memories 170 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

System 100 can further include a user interface 180 and a database 190. User interface 180 can enable one or more users to interact with the system. For example, user interface 180 can allow a user to set parameters of the SEM column or EDX detector that can be used when analyzing a sample. The user interface 180 can include any known device or devices that enable a user to input information to interact with a computer system such as a keyboard, a mouse, a monitor, a touch screen, a touch pad, a voice activated input controller and the like. Database 190 can store information that can be accessed by processor/controller 160 when performing x-ray spectroscopy surface material analysis of a sample as discussed in more detail below.

X-Ray Spectroscopy Challenges

Figure 2:
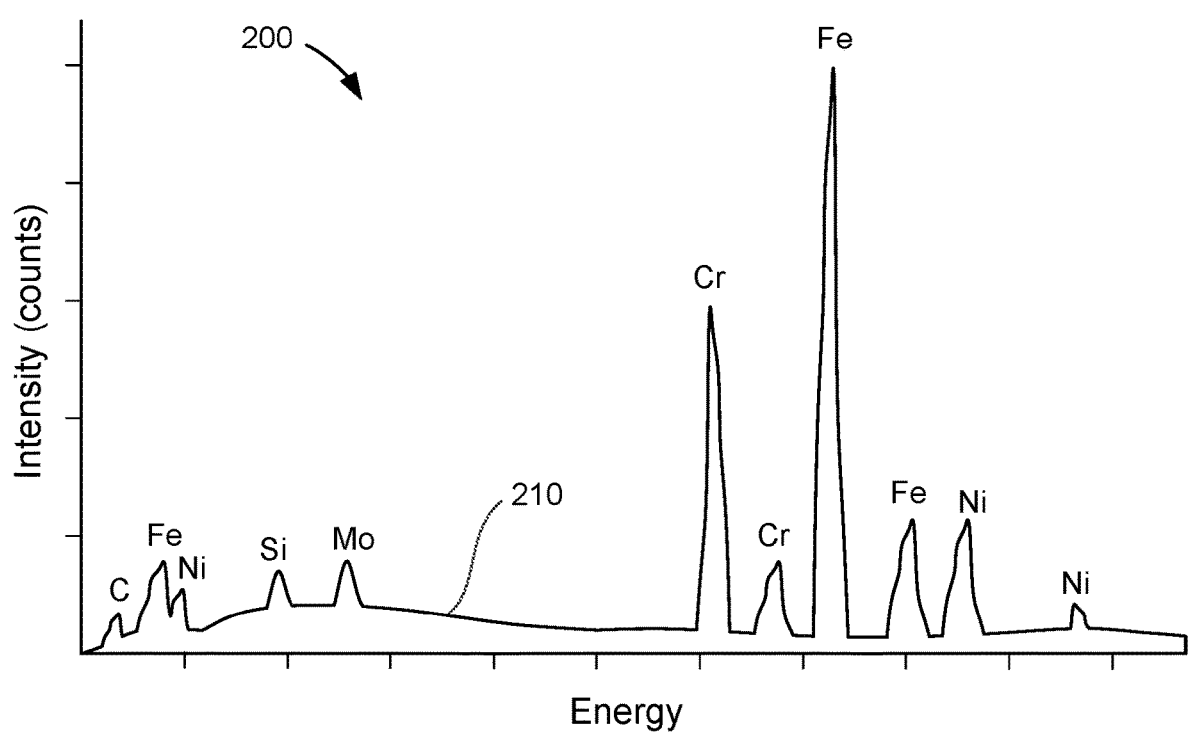
FIG. 2 is an example of an energy-dispersive x-ray spectroscopy graph of a sample material that includes background Bremsstrahlung radiation.

FIG. 2 is an example of an energy-dispersive x-ray spectroscopy graph 200 of a sample material that can be generated by system 100. When a solid target is bombarded by an electron beam, there are two main mechanisms of x-ray emissions that can be detected by EDX detector 150 of system 100: characteristic x-rays and Bremsstrahlung radiation. Characteristic x-rays represent x-ray beams emitted after an inner shell ionization of an atom in the sample material by the bombarded electron followed by an outer shell electron filling the now empty inner shell. Characteristic x-rays have specific energies characteristic to the sample material where the specific energy is equal to the energy difference between the two shells the electron "jumped" between. As an example, the various intensity peaks at different energy levels shown in graph 200 are indicative of different elements within the sample being analyzed and demonstrate that the sample includes at least iron (Fe), chromium (Cr), nickel (Ni) and silicon (Si).

Also depicted in graph 200 is a certain amount of background radiation 210 that is known as Bremsstrahlung radiation. In short, in addition to the characteristic x-rays, x-ray beams are emitted from a sample in random energies when the bombarding electrons are decelerated by the material nuclei. These random energies can also be detected by EDX detector 150 as the x-ray continuum, which represents a background signal with respect to the characteristic x-rays.

Some previously known x-ray imaging processes generally use a landing energy that is approximately three times the ionization energy for the characteristic x-ray of most materials, which can result in such processes using a landing energy in the range of 5-20 keV. Depending on the sample material, such a landing energy can have an x-ray emission depth of hundreds of nanometers or even microns. As used herein, the x-ray emission depth, which can also be referred to as the "signal production range," is the effective depth from which x-ray photons of certain energy can be emitted by electrons of certain landing energy. Since resolution can only be as good as the signal production range of a single electron, a material analysis of a sample using this previously known method can only produce an image with a resolution on the order of the penetration depth, which can be undesirably limiting in some applications.

Figure 3A:
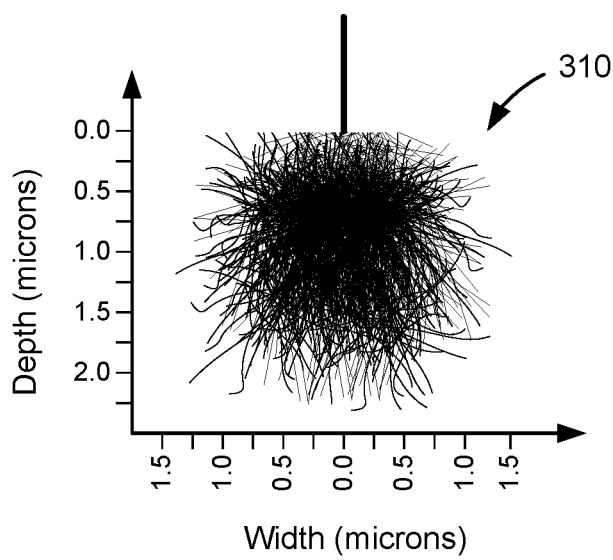
FIGS. 3A-3C are simplified illustrations depicting of the interaction volume of an electron beam in a sample at different landing energies.
Figure 3B:
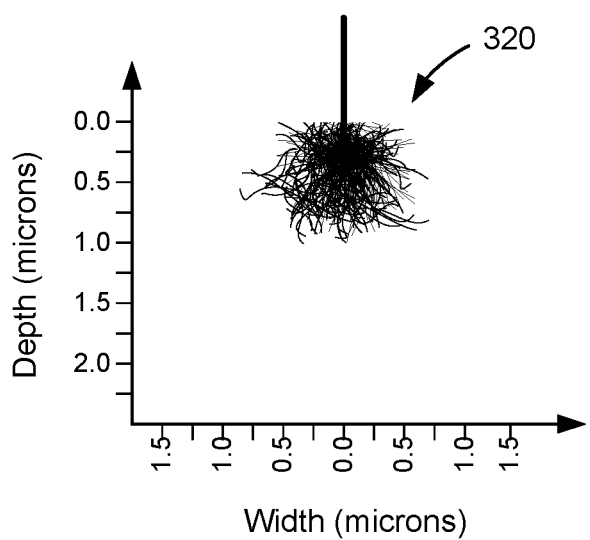
Figure 3C:
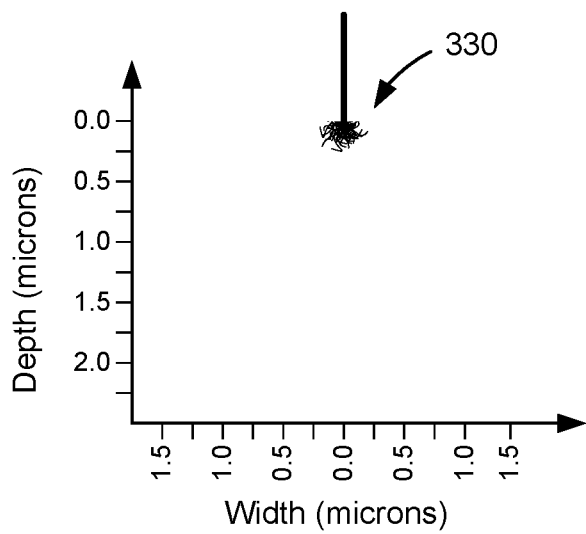

To illustrate, reference is now made to FIGS. 3A-3C, which are simplified illustrations depicting of the penetration depth, which is correlated positively to the x-ray emission depth, and interaction volume of an electron beam in a sample at different landing energies. Specifically, FIG. 3A is a simplified illustration of the interaction volume 310 of an electron beam at a landing energy of 25 kV; FIG. 3B is a simplified illustration of the interaction volume 320 of an electron beam at a landing energy of 15 kV; and FIG. 3C is a simplified illustration of the interaction volume 330 of an electron beam at a landing energy of 5 kV. As evident from a comparison of FIGS. 3A-3C to each other, irradiating a sample with electrons having a landing energy of 25 kV results in a deeper and wider penetration than irradiating the same sample with electrons having a landing energy of 15 kV. Similarly, irradiating a sample with electrons having a landing energy of 15 kV results in a deeper and wider penetration than irradiating the same sample with electrons having a landing energy of 5 kV. Thus, the landing energy used to irradiate a sample (e.g., with electron beam 125) directly impacts the resolution of images generated by system 100 with a lower landing energy directly equating to higher resolution images.

Figure 4A:
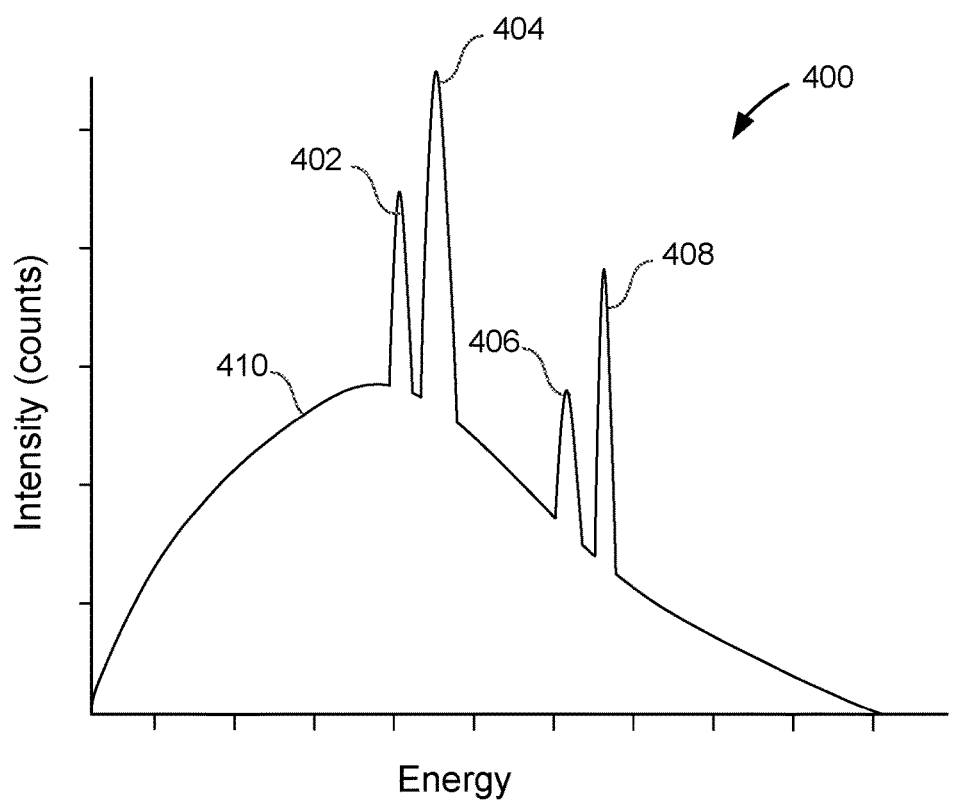
FIGS. 4A and 4B are simplified illustrations depicting a differences in EDX data of a sample exposed to an electron beam at different landing energies.

While using a lower landing energy to irradiate a sample can provide higher resolution than if a higher landing energy is used, the lower landing energy can result in a lower efficiency at detecting the various elements of the sample. To illustrate, reference is now made to FIGS. 4A and 4B, which are simplified illustrations depicting a differences in EDX data of a sample exposed to an electron beam at different landing energies. Specifically, FIG. 4A is a simplified illustration of an EDX graph 400 that depicts characteristic x-rays 402, 404, 406 and 408 along with Bremsstrahlung radiation 410. In graph 400 the sample was bombarded with an electron beam having a relatively high landing energy. As can be seen in graph 400, the intensity of the characteristic x-rays 402-408 is significantly higher than the intensity of Bremsstrahlung radiation 410. Thus, characteristic x-rays 402-408 are relatively easy to detect.

Figure 4B:
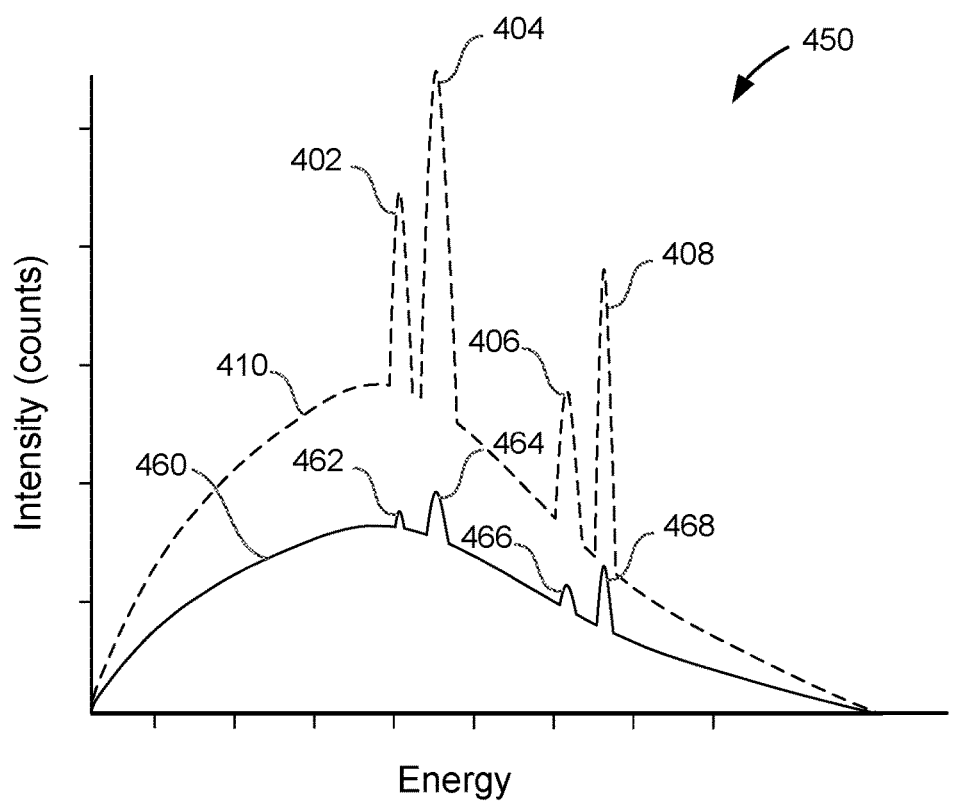

FIG. 4B is a simplified illustration of a second EDX graph 450 that depicts characteristic x-rays 462, 464, 466 and 468 along with Bremsstrahlung radiation 460 superimposed over graph 400. In graph 450 the sample was bombarded with an electron beam having a relatively low landing energy. As can be seen in graph 450, while the intensity of the characteristic x-rays 452-458 is still higher than the intensity of Bremsstrahlung radiation 460, the intensity of the characteristic x-rays relative to the intensity of the Bremsstrahlung radiation has changed dramatically. That is, the ratio between the intensity of the characteristic x-rays and the Bremsstrahlung radiation has decreased significantly making characteristic x-rays 452-458 more difficult to detect. As can be appreciated by a person of skill in the art, if the same sample that was bombarded by an electron beam to produce the graphs in FIGS. 4A and 4B were bombarded by an electron beam with a landing energy significantly lower than that of FIG. 4B, a point can be reached where the characteristic x-rays cannot be accurately detected over the Bremsstrahlung radiation.

The characteristic x-ray signal intensity can be represented by the following formula:

$$\text{Signal} \sim \left(\frac{E}{E_K} - 1\right)^{1.7} \quad (1)$$

The background signal intensity (i.e., the Bremsstrahlung radiation) for signals above approximately 800 eV can be represented by:

$$\text{Background} \sim \left(\frac{E}{E_V} - 1\right) \quad (2)$$

The range of the characteristic x-ray production (in nanometers) can be represented by:

$$\text{Range} = 27.6 \left(\frac{A}{Z^{0.89} \rho}\right) (E^{1.67} - E_K^{1.67}) \quad (3)$$

Where the energies are given in keV, E is the SEM landing energy, $E_k$ is the ionization energy of the characteristic x-ray, $E_v$ is the energy of the Bremsstrahlung radiation, A is the atomic weight of the substrate, Z is the atomic number of the substrate, and p is the density of the substrate in g/cm³.

Separate Scans at Different Landing Energies for Different Materials

Recognizing that the best or ideal landing energy for characteristic x-ray signal analysis is different for the different elemental components of a given sample depending on the analysis requirements, the type of sample scanned, the throughput requirements, the material ionization energy, atomic weight and density, some embodiments of the disclosure perform separate scans at different SEM landing energies for each material to obtain the best resolution material analysis image for each material. The separate images can then be later combined to a single image of a total material analysis. This approach is fundamentally different than other approaches that are known to the inventors where a single scan is used at a single landing energy to characterize the entire region of interest.

In performing separate scans, some embodiments use the lowest landing energy possible until the signal to background ratio (SBR) becomes nearly too low and the characteristic x-ray signal cannot be identified over the Bremsstrahlung radiation background. The lower the landing energy is, the lower the range will be, which in turn, results in a higher resolution of the material analysis mapping.

Figure 5:
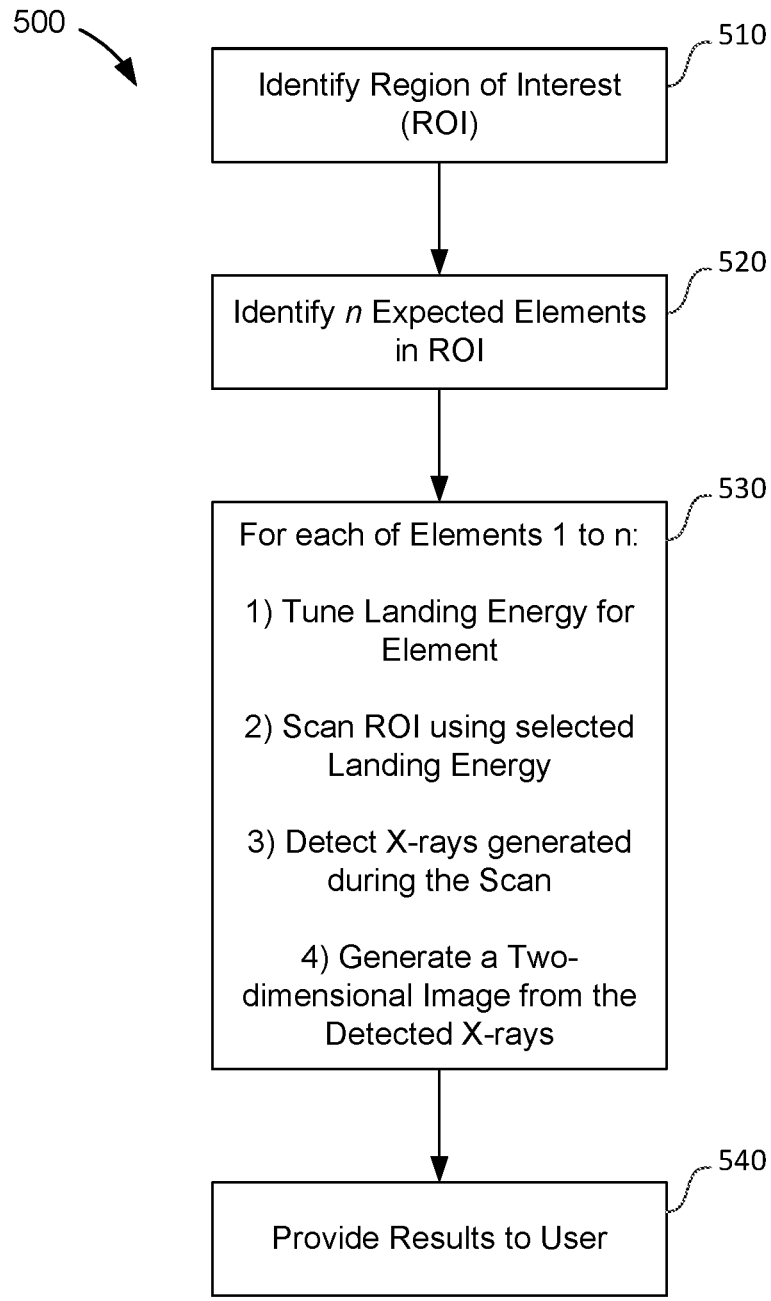
FIG. 5 is a flowchart depicting steps associated with a analyzing a sample according to some embodiments of the disclosure.

FIG. 5 is a flowchart depicting a method 500 of analyzing a sample according to some embodiments of the disclosure. Method 500 can start with a user identifying a region of a sample that is to be evaluated (block 510). For ease of discussion, the identified region is referred to herein as a "region of interest" (ROI). As discussed below with respect to FIG. 7, the ROI can be, for example, an area on a semiconductor wafer. In some instances a user will want to analyze multiple ROI's on a single sample in which case the steps associated with method 500 can be separately performed for each ROI.

Next, one or more elements that are to be analyzed within the ROI are identified (block 520). In some instances the elements can be automatically identified by the evaluation tool (for example, system 100) based on the location of the ROI and a known mapping of features that have been formed on the sample (e.g., from a simulated architecture of the sample). In other instances a user can input one or more elements that the user knows or believes are present within the ROI through a user interface (for example, a keyboard, a touch screen, a mouse or other type of pointer device, a voice controlled input device or any other appropriate input device as described above) associated with the evaluation tool. As an example, if the ROI selected is expected to include one or more electrically conductive lines formed from tungsten separated by silicon oxide isolation regions, the user can input tungsten (W), silicon (Si) and oxygen (O) as expected elements to analyze in the region.

For each element that is identified in block 520, an appropriate landing energy is set for the SEM electron beam and the ROI is scanned using the selected landing energy (block 530). The landing energy used for each element can be determined in any one of several different ways. In some instances, a user can input or otherwise select a specific landing energy for a particular element on a particular sample. The landing energy selected by the user can based on the user's past knowledge and/or experience operating the evaluation system on similar samples, can be based on predetermined instructions the user received (e.g., based on a manufacturer's predetermined evaluation process), can be based on calculations performed by the user either at the time of input or previously performed, or can be based on any other appropriate criteria.

In other instances an appropriate landing energy can be automatically determined by the evaluation system. For example, in some embodiments multiple calibration measurements (e.g., dozens or hundreds or more measurements) can be performed on test samples to determine the lowest landing energy that can be used with a given sample to accurately identify the characteristic x-rays of each particular element within the sample. The calibration measurements can include previously performed tests on samples that are substantially the same as or similar to the sample being evaluated by method 500. For example, the test sample and actual sample being evaluated can include being similar with respect to one or more of the parameters set forth in the equations above (the atomic weight of the substrate, the atomic number of the substrate, the density of the substrate, and the energy of the Bremsstrahlung radiation). Because the ionization energy of each element is different, the landing energy that is determined by the evaluation tool, based on the calibration samples, to accurately detect each element can be different from the ideal landing energy that the system determines to detect other elements in the sample.

The results of the calibration measurements can be stored in a database (e.g., in a lookup table stored in database 190) that is accessible to a processor/controller 160 of the evaluation system. Then, based on the element identified by the user in block 520, processor 160 can automatically select an appropriate landing energy from the database based on the calibration samples that most closely match the attributes of the ROI on the sample being evaluated. For example, a lookup table in the database associate specific, recommended landing energies to specific elements and processor 160 can selects the landing energy for the charged particle beam by accessing the lookup table. In some instances the evaluation system can present the selected landing energy to the user as a recommended landing energy and then allow the user to alter the recommended landing energy by increasing or decreasing the landing energy by a certain amount or selecting a different landing energy altogether.

While the ROI is scanned, x-rays are generated as a result of the irradiation when the electrons impact the surface of the specimen. The generated x-rays can be detected by EDX detector 150 using known techniques to provide, in conjunction with electronic synchronization hardware between the SEM scanning system and the EDX detector, quantitative information about the elemental composition of the sample at the different locations of the scan pattern. A two-dimensional image can also be generated from the detected EDX photons of the actual pattern morphology at the surface of the sample. The generated image can, in turn, be used to characterize various aspects of the sample such as critical dimensions (CD), local or global variation from a simulated architecture (defectivity), the physical location of a pattern relative to other parts of the physical architecture (overlay), as well as other useful information.

Once an ideal or appropriate landing energy is identified for each element, method 500 can include sequentially repeating (block 530), for each of the elements that the user wants to evaluate in the ROI (i.e., the elements identified in block 520), the process of: (i) setting the SEM column to generate an electron beam at the landing energy determined for that element, (ii) scanning the region of interest using that landing energy, (iii) while detecting x-rays generated as a result of the irradiation when the electrons impact the surface of the specimen, and (iv) generating a two-dimensional image of the scanned region from the detected x-rays.

Figure 6:
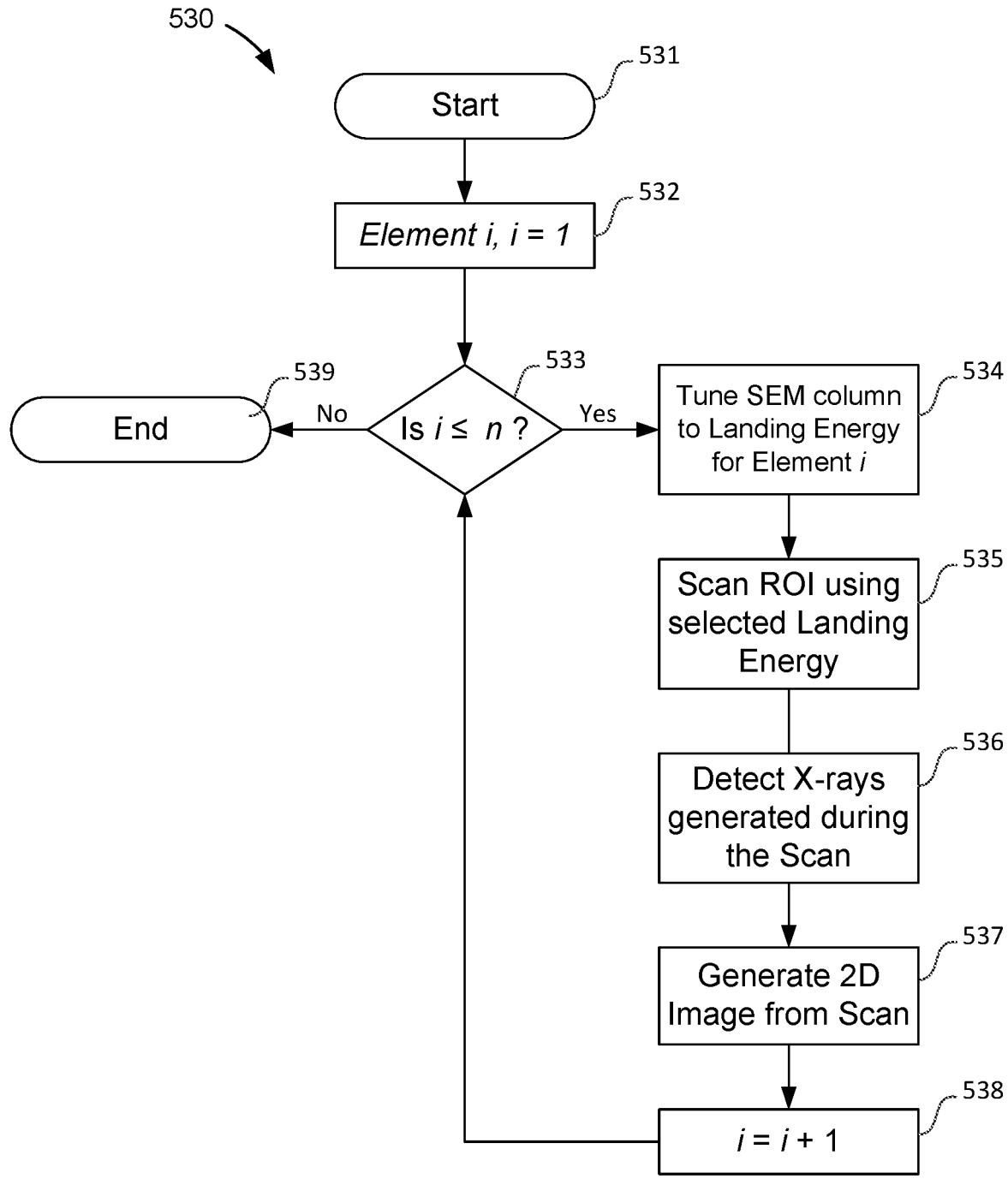
FIG. 6 is a flowchart depicting steps associated with a analyzing a sample according to some embodiments of the disclosure.

FIG. 6 is a simplified flowchart depicting various substeps associated block 530 according to some embodiments. To illustrate, in the example discussed above where a user has identified three elements N, Si and O for evaluation in a given ROI, n is equal to 3 and, for the purposes of the example, we can assume the elements will be analyzed in the order of nitrogen first, silicon second and oxygen last. Thus, in block 532 the first element (nitrogen) is selected and since the process has not yet analyzed the third element (as determined by decision block 533), the SEM column is set to generate an electron beam that has a landing energy appropriate for nitrogen (block 534) and the ROI is scanned using the selected landing energy (block 535).

While the ROI is scanned at the landing energy selected for nitrogen, the x-ray detector can detect x-rays generated as a result of the ROI being irradiated by the electron beam (block 536). The detected x-rays can be used to generate a two-dimension image of the region from the scan as well as characterize other aspects of the ROI (block 537).

Next, i is incremented by one (block 538) and compared to n (block 533), which is three in this example. Since i is now two, it is still less than n and the SEM column is tuned to the landing energy that is appropriate for silicon (block 534). The ROI is scanned using the selected landing energy (block 535), x-rays detected (block 536) and a two-dimensional image generated (block 537). i is then again incremented by one (block 538) and again compared to n (block 533). Block 534 to 537 are then repeated for the third element and i is again incremented by one (block 5368. In this iteration, i is actually greater than n so the comparison (block 533) results in the end of the scanning process (block 539).

Referring back to FIG. 5, once the ROI has been scanned at each landing energy, block 530 is complete and the resulting images can be provided to the user (block 540) as separate two-dimensional images for each of the separate scans and/or as a single two-dimensional image that combines the information from each of the separate scans into a single image of a total material analysis. In some embodiments, two-dimensional images of the scanned ROI can be provided to a user for each element analyzed immediately after the scan for that element is completed (e.g., immediately after each two-dimensional image is generated in block 537).

An Example of a Region of Interest

Figure 7:
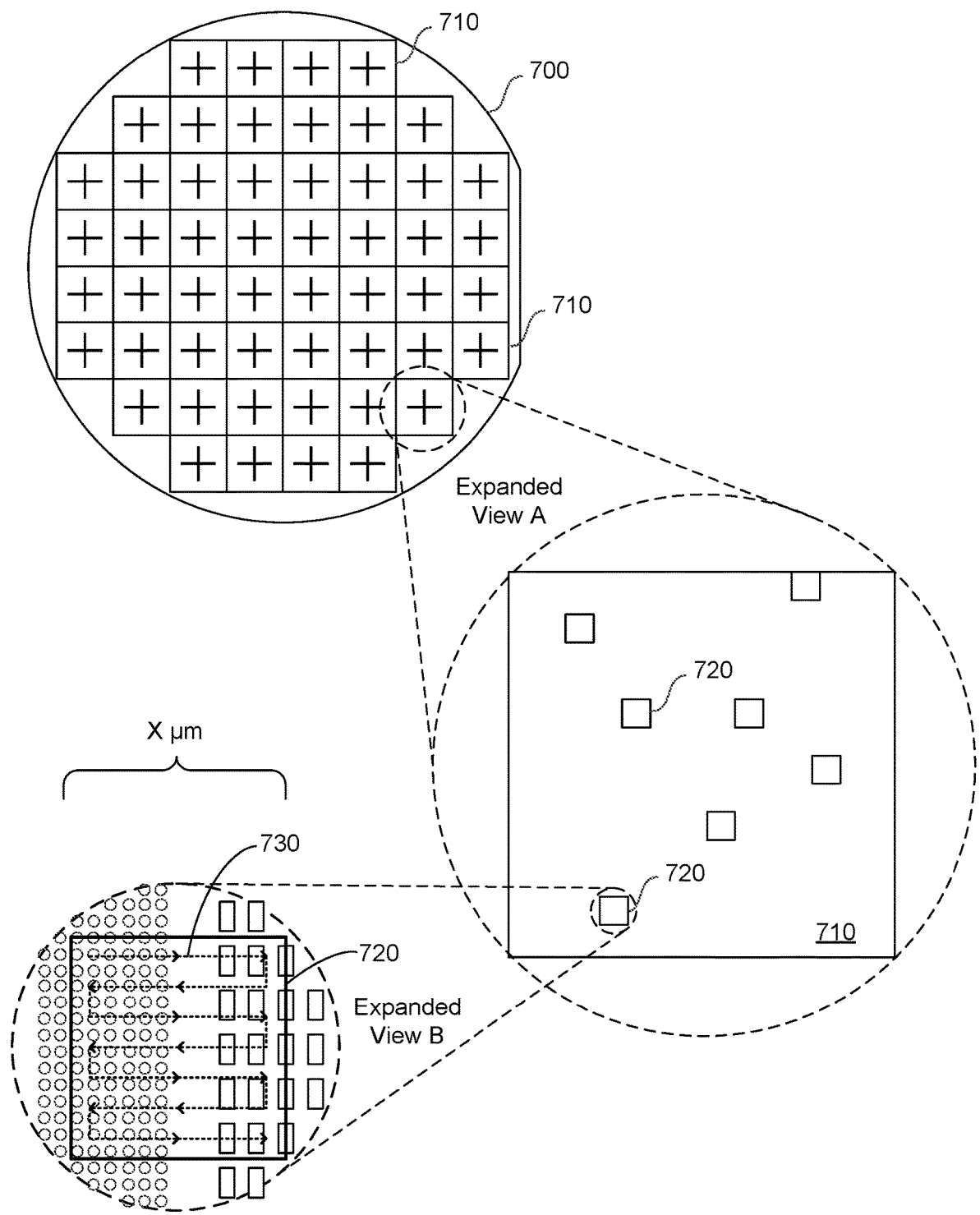
FIG. 7 is a simplified illustration of an area on a semiconductor wafer that can be analyzed according to some embodiments.

To further illustrate an exemplary ROI that can be analyzed in accordance with method 500, reference is made to FIG. 7, which is a simplified illustration of a semiconductor wafer 700. FIG. 7 includes a top view of wafer 700 along with two expanded views of specific portions of wafer 700. Wafer 700 can be, for example, a 200 mm or 300 mm semiconductor wafer and can include multiple integrated circuits 710 (fifty two in the example depicted) formed thereon. The integrated circuits 710 can be at an intermediate stage of fabrication and the x-ray analysis techniques described herein can be used to evaluate and analyze one or more regions of interest (ROI) 720 of the integrated circuits that include multiple elements to be analyzed. For example, Expanded View A of FIG. 7 depicts multiple ROIs 720 of one of the integrated circuits 710 that can be evaluated and analyzed according to the techniques described herein. Expanded View B depicts one of those ROIs 720 that includes several different types of structures that are formed from different materials and can be analyzed using the techniques described herein.

Some embodiments can analyze and evaluate ROI 720 by sequentially scanning region multiple times using different landing energies specifically chosen (e.g., by system 100) based on the materials that a user indicates are likely present within region 720 as discussed above with respect to FIG. 5. The scanning process can scan the charged particle beam back and forth within the ROI according to a raster pattern, such as scan pattern 730 depicted in a simplified format in the Expanded View B of FIG. 7. During each scan, x-rays can be collected and analyzed to determine the elements present at each location of the scan pattern.

The foregoing description, for purposes of explanation, used specific nomenclature to provide a thorough understanding of the described embodiments. However, it will be apparent to one skilled in the art that the specific details are not required in order to practice the described embodiments. For example, while examples of the method disclosed herein were directed towards embodiments in which the sample was a semiconductor wafer, embodiments can be used to evaluate suitable samples other than semiconductor wafers. Also, while the illustrated embodiments discussed using different scans at different landing energies for each element to be detected, in some embodiments a single scan can be used for multiple elements. For example, where the two or more elements identified for evaluation (e.g., in block 520) have similar characteristic energies, a single scan can be performed for the two or more elements as long as the EDX detector can distinguish between the elements.

Thus, the foregoing descriptions of the specific embodiments described herein are presented for purposes of illustration and description. They are not intended to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings.

To the extent the illustrated embodiments in the present patent application can, for the most part, be implemented using electronic components and circuits known to those skilled in the art, details of such are not explained in any greater extent than that considered necessary as illustrated above, for the understanding and appreciation of the underlying concepts of the present patent application and in order not to obfuscate or distract from the teachings of the present disclosure.

What is claimed is:

1. A method of performing x-ray spectroscopy surface material analysis of a region of interest of a sample with an evaluation system that includes a scanning electron microscope (SEM) column and an x-ray detector, the method comprising:
   identifying an element expected to be within the region of interest;
   selecting a landing energy for a charged particle beam generated by the SEM column based on the identified element;
   scanning the region of interest with the charged particle beam set to the selected landing energy;
   detecting x-rays generated while the region of interest is scanned by the charged particle beam; and
   generating a two-dimensional image of the scanned region of interest based on the detected x-rays.

2. The method of claim 1 wherein the two-dimensional image of the scanned region comprises a plurality of pixels and a contrast of the two-dimensional image is determined by an x-ray signal strength of each pixel in the plurality of pixels.

3. The method of claim 1 wherein the evaluation system automatically selects the landing energy for the charged particle beam by accessing a database that associates certain landing energies to certain elements.

4. The method of claim 1 wherein the evaluation system automatically selects the landing energy for the charged particle beam based on a desired spatial resolution input by a user.

5. The method of claim 1 wherein a plurality of elements expected to be within the region of interest are identified and wherein the method comprises sequentially generating a plurality of two-dimensional images of the region of interest corresponding in number to the plurality of identified elements, each two-dimensional image in the plurality of two-dimensional images being generated by:
   selecting a landing energy for a charged particle beam generated by the SEM column based on a unique one of the elements in the plurality of elements;
   scanning the region of interest with a charged particle beam set to the selected landing energy;
   detecting x-rays generated while the region of interest is scanned by the charged particle beam; and
   generating a two-dimensional image of the scanned region of interest based on the detected x-rays.

6. The method of claim 5 further comprising compiling the two-dimensional images generated for each of the plurality of elements into a single image representing a total material analysis.

7. The method of claim 5 wherein the evaluation system identifies the plurality of elements expected within the region of interest based on mapping of the region of interest to a simulated architecture of the sample.

8. The method of claim 5 wherein the evaluation system identifies the plurality of elements expected within the region of interest based on an initial high energy x-ray scan of the entire region of interest.

9. The method of claim 5 further comprising wherein a user can identify the plurality of elements to the evaluation system through a user interface to the system.

10. The method of claim 5 wherein the evaluation system automatically identifies a landing energy for each of the plurality of elements based on calibration data stored in a database.

11. The method of claim 5 wherein the evaluation system presents an initial recommendation for a landing energy for each of the plurality of elements to a user based on calibration data stored in a database and the user can accept or update the recommended landing energy through a user interface to the system.

12. The method of claim 5 further comprising wherein a user identifies a landing energy for each of the plurality of elements to the evaluation system through a user interface to the system.

13. The method of claim 5 wherein a different landing energy is selected for each of the elements in the plurality of elements.

14. The method of claim 1 wherein at least first and second elements expected to be within the region of interest are identified, the first element having a first characteristic energy and the second elements having a second characteristic energy different from the first characteristic energy, and wherein the method comprises:
   generating a first two-dimensional image, comprising a first plurality of pixels, of the region of interest by: (i) selecting a first landing energy for a charged particle beam generated by the SEM column based the first element; (ii) scanning the region of interest with a first charged particle beam set to the first landing energy; (iii) detecting a first set of x-rays generated while the region of interest is scanned by the first charged particle beam; and (iv) generating the first two-dimensional image of the scanned region of interest based on the first set of detected x-rays, where a contrast of the first two-dimensional image is determined by an x-ray signal strength of each pixel in the first plurality of pixels; and
   generating a second two-dimensional image, comprising a second plurality of pixels, of the region of interest by: (i) selecting a second landing energy for a charged particle beam generated by the SEM column based the second element, the second landing energy being different than the first landing energy; (ii) scanning the region of interest with a second charged particle beam set to the second landing energy; (iii) detecting a second set of x-rays generated while the region of interest is scanned by the second charged particle beam; and (iv) generating the second two-dimensional image of the scanned region of interest based on the second set of detected x-rays, where a contrast of the second two-dimensional image is determined by an x-ray signal strength of each pixel in the second plurality of pixels.

15. A system for performing x-ray spectroscopy surface material analysis of a region of interest of a sample, the system comprising:
a vacuum chamber;
a sample support configured to hold a sample within the vacuum chamber during a sample evaluation process;
a scanning electron microscope (SEM) column configured to direct a charged particle beam into the vacuum chamber toward the sample;
a processor and a memory coupled to the processor, the memory including a plurality of computer-readable instructions that, when executed by the processor, cause the system to:
identify an element expected to be within the region of interest;
select a landing energy for the charged particle beam generated by the SEM column based on the identified element;
scan the region of interest with the charged particle beam set to the selected landing energy;
detect x-rays generated while the region of interest is scanned by the charged particle beam; and
generate a two-dimensional image of the scanned region of interest based on the detected x-rays.

16. The system set forth in claim 15 wherein plurality of computer-readable instructions, when executed by the processor, further cause the system to identify a plurality of elements expected to be within the region of interest and, sequentially generate a plurality of two-dimensional images of the region of interest corresponding in number to the plurality of identified elements, each two-dimensional image in the plurality of two-dimensional images being generated by:
selecting a landing energy for a charged particle beam generated by the SEM column based on a unique one of the elements in the plurality of elements;
scanning the region of interest with a charged particle beam set to the selected landing energy;
detecting x-rays generated while the region of interest is scanned by the charged particle beam; and
generating a two-dimensional image of the scanned region of interest based on the detected x-rays.

17. The system set forth in claim 16 wherein the plurality of computer-readable instructions, when executed by the processor, further cause the system to compile the two-dimensional images generated for each of the plurality of elements into a single image representing a total material analysis.

18. A non-transitory computer-readable memory that stores instructions for performing x-ray spectroscopy surface material analysis of a region of interest of a sample by:
identifying an element expected to be within the region of interest;
selecting a landing energy for a charged particle beam generated by an SEM column based on the identified element;
scanning the region of interest with the charged particle beam set to the selected landing energy;
detecting x-rays generated while the region of interest is scanned by the charged particle beam; and
generating a two-dimensional image of the scanned region of interest based on the detected x-rays.

19. The non-transitory computer-readable memory set forth in claim 18 wherein the instructions stored in the non-transitory computer-readable memory for performing x-ray spectroscopy surface material analysis of a region of a sample further include instructions for identifying a plurality of elements expected to be within the region of interest and, sequentially generating a plurality of two-dimensional images of the region of interest corresponding in number to the plurality of identified elements, each two-dimensional image in the plurality of two-dimensional images being generated by:
selecting a landing energy for a charged particle beam generated by the SEM column based on a unique one of the elements in the plurality of elements;
scanning the region of interest with the charged particle beam set to the selected landing energy;
detecting x-rays generated while the region of interest is scanned by the charged particle beam; and
generating a two-dimensional image of the scanned region of interest based on the detected x-rays.

20. The non-transitory computer-readable memory set forth in claim 19 wherein the instructions stored in the computer-readable memory further include instructions to compile the two-dimensional images generated for each of the plurality of elements into a single image representing a total material analysis.

* * * * *